US012410205B2

(12) United States Patent
Doppiu et al.

(10) Patent No.: US 12,410,205 B2
(45) Date of Patent: Sep. 9, 2025

(54) TRIMETHYLPLATINUM(IV) IODIDE

(71) Applicant: UMICORE AG & CO. KG, Hanau-Wolfgang (DE)

(72) Inventors: Angelino Doppiu, Seligenstadt (DE); Ralf Karch, Kleinostheim (DE); Eileen Woerner, Nidderau (DE)

(73) Assignee: UMICORE AG & CO. KG, Hanau-Wolfgang (DE)

( * ) Notice: Subject to any disclaimer, the term of this patent is extended or adjusted under 35 U.S.C. 154(b) by 672 days.

(21) Appl. No.: 17/639,667

(22) PCT Filed: Mar. 26, 2021

(86) PCT No.: PCT/EP2021/058054
§ 371 (c)(1),
(2) Date: Mar. 2, 2022

(87) PCT Pub. No.: WO2021/186087
PCT Pub. Date: Sep. 23, 2021

(65) Prior Publication Data
US 2022/0289780 A1 Sep. 15, 2022

(30) Foreign Application Priority Data
Mar. 20, 2020 (EP) .................................... 20164599

(51) Int. Cl.
*C07F 15/00* (2006.01)
*C23C 16/18* (2006.01)

(52) U.S. Cl.
CPC .......... *C07F 15/0086* (2013.01); *C23C 16/18* (2013.01)

(58) Field of Classification Search
CPC ................... C07F 15/0086; C01G 55/001
See application file for complete search history.

(56) References Cited

U.S. PATENT DOCUMENTS 4,329,274 A 5/1982 Faltynek
5,929,267 A 7/1999 Kadokura

FOREIGN PATENT DOCUMENTS

JP H07-258852 A 10/1995
JP 2001-504159 3/2001
WO 98/00432 A1 1/1998

OTHER PUBLICATIONS

B. N. Ghosh, et al. 16(5) Crystal Growth & Design 2527-2534 (2016) ("Ghosh") (Year: 2016).*
G. I. Zharkova, 37 Russian Journal of Coordination Chemistry 680-687 (2011) (Year: 2011).*
Halogenate-Oxford Dictionary 2015 (Year: 2015).*
N.G. Anderson, Practical Process & Research Development 81-111 (2000) ("Anderson"). (Year: 2000).*
J.C. Baldwin, et al, 14 Inorganic Chemistry, 2020-2020 (1975) (Year: 1975).*
Office Action mailed Mar. 6, 2023 for Japanese Patent Application No. 2022-500725 (4 pages in Japanese, 6 pages English Translation).
Translation of the Written Opinion of the International Searching Authority mailed May 4, 2021 for International Patent Application No. PCT/EP2021/058054 (6 pages).
International Preliminary Report on Patentability mailed Sep. 20, 2022 for International Patent Application No. PCT/EP2021/058054 (6 pages in German; 7 pages English translation).
International Search Report for PCT/EP2021/058054, dated May 4, 2021 (7 pgs.).
Written Opinion of the International Searching Authority for PCT/EP2021/058054, dated May 4, 2021 (5 pgs.).
W. J. Pope, et al., The Alkyl Compounds of Platinum, J. Chem. Soc. 1909, 95, (pp. 571-576).
H. C. Clark, et al., A Convenient Synthesis for a Variety of Methyl- and Trifluormethylplatinum Complexes, J. Organometallic_Chem._ 1972_38 (2 pgs.).
A. Helman, Preparation of Alkyl Platinum Compounds from Zeise's Salt, Reports of Academy Sciences of the USSR_Gorushkina_ Doklady_Akad_Nauk_SSSR_1947 vol. LVII No. 3 (10 pgs. with Machine English Translation).
H. Gilman, et al., Organoplatinum Compounds, J. Am. Chem. Soc. 1953, 75 (pp. 2063-2065).
L. D. Boardman, et al., $^{195}$Pt NMR Study of ($n^5$-Cyclopentadienyl)trialkylplatinum(IV( Complexes, Magnetic Resonance in Chemistry, 1992, 30 (pp. 481-489).
V. M. Kharchevnikov, Synthesis of Alkyl Compounds of Platinum from Ammonium Chloroplatinate_Zhurnal_Obshchei_Khimm_1973,_ 43 (16 pgs. with Machine English Translation).
D. E. Clegg, et al., Iodo(trimethyl)platinum(IV), Inorganic Syntheses, 1967, 10 (pp. 70-75).
T. G. Appleton, et al., Displacement of Norbornadiene (NBD) from $PtMe_2(NBD)$ by N-Donors, Dimethylsulfoxide, and Cyanide, and Reactions of $_{cis}$-$PtMe_2L_2$ with Iodomethane, J. Organometallike Chem., 1986, 303 (pp. 139-149).
G. I. Zharkova, et al., Volatile fluorinated trimethylplatinum(IV) ß-diketonates: Synthesis, properties, and structure, Polyhedron, 2012, 40 (pp. 40-45).

(Continued)

*Primary Examiner* — Alexander R Pagano
*Assistant Examiner* — Frank S. Hou
(74) *Attorney, Agent, or Firm* — Smith, Gambrell & Russell, LLP

(57) ABSTRACT

The invention relates to a method for producing trimethylplatinum(IV) iodide and trimethylplatinum(IV) iodide obtainable according to said method and the use thereof as a reactant for producing platinum(IV) compounds, as a precatalyst and as a catalyst. The platinum(IV) compounds thus obtainable, as well as the use thereof as precursors for the deposition of platinum layers and platinum-containing layers on a surface of a substrate are also the subject matter of the invention. The invention also relates to a substrate comprising a platinum layer or a platinum-containing layer on a surface, and to a method for producing an electronic component, in particular an electronic semiconductor component, or an electrode for a fuel cell using a platinum(IV) compound obtainable using trimethylplatinum(IV) iodide, which is obtainable by means of the method described herein.

18 Claims, No Drawings

(56) References Cited

OTHER PUBLICATIONS

J. C. Baldwin, et al., Improved Isolation Procedure for the Preparation of Iodo(trimethyl)platinum(IV), Inorganic Chem, 1976, vol. 14 No. 8 (1 pg.).
G. R. Hoff, et al., Some Properties of Several Trimethylplatinum (IV) Compounds, Inorg. Chem., 1968, 7 (pp. 1655-1656).
Office Action mailed Dec. 16, 2024 for Japanese Patent Application No. 2023-140498 (5 pages in Japanese; 5 Pages English translation).

* cited by examiner

TRIMETHYLPLATINUM(IV) IODIDE

Trimethylplatinum(IV) iodide ($Me_3PtI$), methods for the production thereof and the use thereof are known.

Trimethylplatinum(IV) iodide is used, for example, as a reactant for the production of diverse platinum(IV) complexes, e.g., of (cyclopentadienyl)trimethylplatinum(IV) and derivatives thereof. The latter are used, inter alia, as platinum precursors in atomic layer deposition processes (ALD), metal organic chemical vapor deposition processes (MOCVD), or metal organic chemical vapor phase epitaxy processes (MOVPE) for the deposition of platinum layers or platinum-containing layers.

In 1909, Pope and Peachey (*J. Chem. Soc.* 1909, 95, 571) were the first to report on the synthesis of this platinum(IV) compound, starting from anhydrous platinum(IV) chloride and a large excess of the Grignard reagent methylmagnesium iodide (MeMgI). Essentially, three methods for preparing trimethylplatinum(IV) iodide are known from the prior art:

a. reacting a dimethylplatinum(11) compound $Pt(L)Me_2$ with iodomethane (MeI) in benzene, wherein L=COD=1,5-cyclooctadiene or L=NBD=bicyclo[2.2.1]heptane-2,5-dienyl, (H. C. Clark and L. E. Manzer, *J. Organomet. Chem.* 1972, 38, C41—C42; T. G. Appleton et al., *J. Organomet. Chem.* 1986, 303, 139-149);

b. reacting a platinum(II) compound, for example anhydrous Zeise's salt $K[(C_2H_4)PtCl_3]$, with the Grignard reagent MeMgI in a diethyl ether/benzene mixture as solvent (Herman, Gorushkina, *Doklady Akad. Nauk, S.S.S.R.* 1947, 57, 259-261); and c. reacting a platinum(IV) compound, such as $PtCl_4$ (H. Gilman et al., *J. Am. Chem. Soc.* 1953, 75, 2063-2065), $K_2PtCl_6$ (L. D. Boardman and R. A. Newmark, *Magnetic Resonance in Chemistry* 1992, 30, 481-489) or $(NH_4)_2[PtCl_6]$ (V. M. Kharchevnikov, *Zhumal Obshchei Khimii* 1973, 43, 817-821), with the Grignard reagent MeMgI in a diethyl ether/benzene mixture or the Grignard reagent MeMgI, produced starting from magnesium and an excess of MeI, in a diethyl ether/benzene mixture (e.g., D. E. Clegg and J. R. Hall, *Inorganic Syntheses* 1967, 10, 71-74) or methyllithium (MeLi) in a diethyl ether/tetrahydrofuran mixture and subsequent addition of a saturated potassium iodide solution (e.g., L. D. Boardman and R. A. Newmark, *Magnetic Resonance in Chemistry* 1992, 30, 481-489).

One disadvantage of the synthetic route for the production of $Me_3PtI$ given under a. is that it is overall a three-stage and thus labor-intensive and cost-intensive route. A first stage is to produce $Pt(L)Cl_2$ which is reacted with MeLi to form $Pt(L)Me_2$ in a second step. The latter then reacts with MeI to form $Me_3PtI$. The reaction of $Pt(NBD)Me_2$ with MeI in benzene provides high-purity trimethylplatinum(IV) iodide (white solid) in a very good yield (97%) (T. G. Appleton et al., *J. Organomet. Chem.* 1986, 303, 139-149).

In the simplest case, only one synthesis step is required within the scope of synthesis routes b. and c., otherwise, however, at least one one-pot method is possible. However, the respective methylation reagent, i.e., the Grignard reagent, and optionally additionally iodomethane, or methyllithium, is usually used in relatively large excess in relation to the amount of Pt metal used. Molar ratios of Pt metal:MeMgI of 1:4.2 and 1:5, molar ratios of Pt metal: MeMgI:MeI of 1:4.6:3.2 and 1:7:4.5 and 1:11:8.4 and a molar ratio of Pt metal. MeLi of at least 1:8, e.g., 1:8.2 are given, for example. From an (atom) economical and ecological perspective, this is disadvantageous, especially since no satisfactory results are achieved in terms of yield and/or product purity, which can in particular already be seen from the product color. When a comparatively low excess of the Grignard reagent MeMgI is used, a relatively intensive coloration and/or a relatively low yield of the trimethylplatinum(IV) iodide is reported (cf.: H. Gilman et al., *J. Am. Chem. Soc.* 1953, 75, 2063-2065: the molar ratio of Pt metal : MeMgI is 1: 4.2; G. I. Zharkova et al., *Polyhedron* 2012, 40, 40-45: the molar ratio of Pt metal : MeMgI is 1:5). According to a protocol by Hel'man and Gorushkina, trimethylplatinum(IV) iodide is obtained using MeMgI and MeI in the form of orange crystals in a yield of approximately 70% (Doklady Akad. Nauk, S.S.S.R. 1947, 57, 259-261: the molar ratio Pt metal:MeMgI:MeI is 1:4.6:3.2). In the case of an even greater excess of the Grignard reagent MeMgI with the addition of MeI or with the use of a relatively large excess of the methylation reagent MeLi, a lighter color of the isolated trimethylplatinum(IV) iodide is specified in each case; at 70% to 89%, the yields are moderate to good (cf.: J. C. Baldwin and W. C. Kaska, *Inorg. Chem.* 1975, 14, 2020: the molar ratio Pt metal:MeMgI: MeI is 1:11:8.4; D. E. Clegg and J. R. Hall, *Inorganic Syntheses* 1967, 10, 71-74: the molar ratio of Pt metal:MeMgI:MeI is 1:7: 4.5; L. D. Boardman and R. A. Newmark, *Magnetic Resonance in Chemistry* 1992, 30, 481-489: the molar ratio of Pt metal : MeLi is 1:8.2).

Trimethylplatinum(IV) iodide is obtained in very different colors by means of the preparation methods described in the prior art. Thus, said platinum(IV) compound is described inter alia as a white (T. G. Appleton et al., *J. Organomet. Chem.* 1986, 303, 139-149), yellow (D. E. Clegg and J. R. Hall, *Inorganic Syntheses* 1967, 10, 71-74), and orange-colored solid (G. I. Zharkova et al., *Polyhedron* 2012, 40, 40-45; orange-colored crystals: Hel'man, Gorushkina, Doklady Akad. Nauk, S.S.S.R. 1947, 57, 259-261). The varying visual appearance of the isolated products indicates a wide range of product qualities or degrees of purity. According to Hoff and Brubaker (*Inorg. Chem.* 1968, 7, 1655-1656), trimethylplatinum(IV) iodide is present in the solid as a tetramer $[Me_3PtI]_4$, regardless of whether it was obtained as a white or yellow solid. The authors assume that the yellow coloration is due to a slight contamination by iodine.

Moreover, the yields achieved by means of the known synthesis routes vary. The prior art discloses specifications of 45% (H. Gilman et al., *J. Am. Chem. Soc.* 1953, 75, 2063-2065) to 97% (T. G. Appleton et al., *J. Organomet. Chem.* 1986, 303, 139-149). In accordance with Kharchevnikov (*Zhumal Obshchei Khimii* 1973, 43, 817-821), the total yield of trimethylplatinum(IV) iodide, i.e., of the dimer $[Me_3PtI]_2$ and of the tetramer $[Me_3PtI]_4$ together, increases from 12% to 86% when the molar ratio of $(NH_4)_2PtCl_6$:MeMgI of 1: 2 is increased to 1:15. In addition, Kharchevnikov describes a decrease in the yield from 87% to 8% when the mole fraction of diethyl ether in the diethyl ether/benzene mixture used is increased from 0.15 to 1.0. Furthermore, Boardman and Newmark (Magnetic Resonance in Chemistry 1992, 30, 481-489) report that, in the reaction of $K_2[PtCl_6]$ with MeLi, not only is the use of a large excess of the methylation reagent required, but a relatively low temperature has to be maintained as well. Thus, the use of fewer than eight molar equivalents of MeLi or a reaction temperature above 5° C. to 10° C. resulted in significant yield losses.

A disadvantage of the aforementioned synthesis routes is that the product units and yields achieved are largely unsatisfactory and, in part, not reproducible. This can be attributed to the formation of by-products which can, in part, only be removed with difficulty or not at all. It is also disadvantageous that a reaction of the respective raw product with silver sulfate and subsequent addition of potassium iodide are required in order to purify the trimethylplatinum(IV) iodide, which is regularly obtained in a relatively lower quality and is more or less intensively colored by iodine contaminations in particular (D. E. Clegg and J. R. Hall, *Inorganic Syntheses* 1967, 10, 71-74).

Consequently, according to the prior art described herein, the preparation of trimethylplatinum(IV) iodide with satisfactory purity and yield is only possible with comparatively high labor and costs, in particular according to the route mentioned under a.

Overall, the synthesis routes known from the literature for the production of trimethylplatinum(IV) iodide are to be classified as unsatisfactory from an ecological and (atom) economical perspective. One important reason is that, in many cases, a comparatively low selectivity and consequently a low yield, including space-time yield, and/or purity of the trimethylplatinum(IV) iodide obtained is achieved. The term "space-time yield" refers here to a product quantity formed per space and time within a reaction container or reaction vessel.

The object of the invention is therefore to overcome these and other disadvantages of the prior art and to provide a method with which trimethylplatinum(IV) iodide can be produced easily, cost-effectively, and reproducibly with a high degree of purity, in particular, substantially free of impurities by magnesium, sodium, and potassium salts, and elemental iodine, and at good yields, including space-time yields. In particular, the purity of the trimethylplatinum(IV) iodide should satisfy the requirements placed on catalysts, precatalysts, and on reactants for producing precursors for chemical vapor deposition processes. The method should furthermore be characterized in that it can also be carried out on an industrial scale with comparable yield and purity of the trimethylplatinum(IV) iodide, and the formation of by-products that are difficult to separate or cannot be separated at all is reduced or avoided. The invention furthermore relates to trimethylplatinum(IV) iodide obtainable or obtained according to the claimed method, and to the use thereof. In addition, a method for producing platinum(IV) compounds is to be provided, by means of which said compounds can be produced easily, cost-effectively, and reproducibly with a high degree of purity and good yields, including space-time yields. The platinum(IV) compounds are to be able to be prepared using the trimethylplatinum(IV) iodide obtainable or obtained according to the claimed method. Furthermore, the subject matter of the invention is a substrate having at least one platinum layer or one platinum-containing layer on at least one surface. The respective layer should be able to be produced using a platinum(IV) compound obtainable or obtained according to the claimed method. Moreover, the invention relates to a method for producing an electronic component or an electrode for a fuel cell using a platinum(IV) compound obtained or obtainable according to the method claimed herein.

The main features of the invention are defined in the claims.

The object is achieved by a method for producing trimethylplatinum(IV) iodide, comprising reacting at least one platinum compound selected from the group consisting of platinum(II) compounds and platinum(IV) compounds, with at least one methyl Grignard compound according to the general formula MeMgX, wherein X are independently selected from the group consisting of Cl, Br, and I, and iodomethane in an aprotic polar solvent $S_A$ comprising an ether $S_E$ and a halogenated hydrocarbon $S_H$, wherein a molar ratio of Pt metal:MeMgX:iodomethane is between 1:4:4 and 1:6:6.

In the context of the present invention, the expression "trimethylplatinum(IV) iodide" includes all solvent-free molecular formulae of said platinum(IV) compound, in particular $Me_3PtI$ and those of the oligomers $[Me_3PtI]_2$ and $[Me_3PtI]_4$.

The "at least one platinum compound" may also be a mixture comprising at least two platinum compounds selected from the group consisting of platinum(II) compounds and platinum(IV) compounds.

The order in which a reaction vessel is charged with the reactants, namely the at least one platinum compound, the methyl Grignard compound according to the general formula MeMgX and the iodomethane, can be freely selected. This order has no influence on the success of the reaction, particularly not on the purity and yield of the trimethylplatinum(IV) iodide obtained or obtainable in solution or as a solid using this method.

The terms "reaction container" and "reaction vessel" in the context of the present invention are used synonymously and are not limited to a volume, material composition, equipment, or form. Suitable reaction vessels include, for example, glass flasks, enameled reactors, stirred tank reactors, pressure vessels, tube reactors, microreactors, and flow reactors.

The method for producing trimethylplatinum(IV) iodide described herein can be carried out as a discontinuous process or as a continuous process.

The aprotic polar solvent $S_A$ may also be a solvent mixture containing more than one ether $S_E$ and/or more than one halogenated hydrocarbon $S_H$. One embodiment of the method provides that the at least one ether $S_E$ and the at least one halogenated hydrocarbon $S_H$ are miscible. The aprotic polar solvent $S_A$ may comprise further aprotic polar solvents which are miscible with the at least one ether $S_E$ and the at least one halogenated hydrocarbon $S_H$.

In the context of the present invention, two solvents are referred to as miscible if they are miscible at least during the respective reaction, that is, are not present as two phases.

Compared to methods from the prior art, the method described herein achieves an improvement in product quality, i.e., product purity, while simultaneously increasing the yield, including the space-time yield. Surprisingly, a very high product purity is achieved, although, in relation to the amount of platinum metal used, a comparatively small excess of the methylation reagent according to the general formula MeMgX is used with the addition of iodomethane. This is surprising, particularly in view of previously known methods for the preparation of trimethylplatinum(IV) iodide. This is because, as explained above, for a similar molar ratio of Pt metal:MeMgI MeI, namely 1:4.6:3.2, the prior art describes that trimethylplatinum(IV) iodide was isolated after a relatively complex recrystallization from hot benzene in the form of orange crystals, wherein the yield was moderate at approximately 70%. Only when a significantly larger excess of the Grignard reagent MeMgI was used, which is disadvantageous from an (atom) economical and ecological perspective, and when MeI was added, was light-colored trimethylplatinum(IV) iodide isolated in some cases at moderate to good yields of 70% to 89%.

In contrast to the previously known synthesis strategies, in the method described herein, a comparatively small excess of the methylation reagent is sufficient to obtain and/or isolate trimethylplatinum(IV) iodide at an almost quantitative yield and with a very high degree of purity. Thus, for example, when $K_2[PtCl_6]$ is reacted with MeMgI and MeI in a molar ratio of Pt:MeMgI:MeI of 1:5:5 and a diethyl ether/dichloromethane mixture is used in a volume ratio of 0.86:1, the target compound is obtained as an off-white, partially crystalline powder at a yield of approximately 98%. The trimethylplatinum(IV) iodide obtained or obtainable as an isolated solid or in solution by means of the method claimed herein has no impurities or almost no impurities caused by salts produced during its production. In particular, the content of magnesium salts and potassium and/or sodium salts is demonstrably relatively low. The magnesium content of the isolated product trimethylplatinum(IV) iodide determined in the aforementioned example by means of ICP-OES was <300 ppm; the potassium content determined by means of ICP-OES was <50 ppm. Usually, impurities caused by elemental iodine can already be identified visually, namely based on the characteristic yellow, orange, red, or brown color as the iodine content increases. However, trimethylplatinum(IV) iodide isolated by means of the method claimed herein is present as an off-white or white powder, which is generally at least semi-crystalline, or in the form of off-white or white crystals so that iodine impurities are present at trace levels at most. Thus, trimethylplatinum(IV) iodine obtained or obtainable by means of the method described herein is referred to as "substantially free of impurities by elemental iodine."

The claimed method also differs from the methods disclosed in the prior art by the choice of solvent. Instead of the diethyl ether/benzene mixture commonly used, the aprotic polar solvent $S_A$ is provided here, which comprises the ether $S_E$ and the halogenated hydrocarbon $S_H$. A volume ratio of ether $S_E$: halogenated hydrocarbon $S_H$ may, for example, be between 0.5:1 and 1:5, advantageously between 0.75:1 and 1:4, in particular between 0.85:1 and 1:3.

The comparatively low solubility of the salts typically obtained as by-products, such as NaCl, KCl, $MgCl_2$, and $MgI_2$, in the aprotic polar solvent $S_A$ is particularly advantageous. A quantitative or almost complete separation of the salt load can thus be realized by means of a work step that can be carried out quickly and easily, namely by filtration and/or by centrifugation and/or by decantation. Subsequently, the filtrate, centrifugate, or decantate may advantageously and optionally be subjected to further purification and/or isolation steps which may be carried out rapidly and without complication and without special effort in terms of preparation, in particular without ensuring an inert gas atmosphere. Overall, the purification and/or isolation of the product is relatively simple.

In summary, it should be noted that trimethylplatinum(IV) iodide can be produced in a simple, cost-effective, and reproducible manner using the method claimed herein. The target compound is obtained with a very high degree of purity, in particular substantially free of impurities by magnesium, sodium, and potassium salts, and elemental iodine, and at good to very good yields, including space-time yields. The formation of by-products that are separable with difficulty or not at all, in particular elemental iodine, is advantageously reduced or completely avoided. Based on the solvent mixture selected, salt loads produced, e.g., in the form of NaCl, KCl, $MgCl_2$, or $MgI_2$, can advantageously be completely or almost quantitatively separated. The purity of the trimethylplatinum(IV) iodide thus obtained or obtainable therefore satisfies the requirements placed on catalysts, precatalysts, and reactants for producing precursors for chemical vapor deposition processes. In addition, the method described herein can also be carried out on an industrial scale, wherein trimethylplatinum(IV) iodide is obtainable or obtained at comparable yields, including space-time yields, and degrees of purity.

Overall, the method claimed herein for the production of trimethylplatinum(IV) iodide is to be classified as satisfactory from an ecological and (atom) economical perspective.

In the context of this invention, the expression "substantially free of impurities by magnesium salts" refers to a magnesium content in the isolated product trimethylplatinum(IV) iodide of ≤500 ppm, ideally ≤300 ppm. The expression "substantially free of impurities by potassium salts" refers to a potassium content of ≤100 ppm, ideally ≤50 ppm; the same applies to the expression "substantially free of impurities by sodium salts." In the context of the present invention, the expression "substantially free of impurities by elemental iodine" is used for isolated trimethylplatinum(IV) iodide, which is present in particular as an off-white or white, optionally at least semi-crystalline, powder or in the form of off-white or white crystals.

In one embodiment of the method for producing trimethylplatinum(IV) iodide, at least one platinum compound is a platinum(II) salt or a platinum(IV) salt, wherein platinum(II) or platinum(IV) is contained in the cation or in the anion. Advantageously, at least one platinum compound is a platinum(IV) salt, wherein platinum(IV) is contained in the cation or in the anion.

In a further variant of the method, at least one platinum halide or at least one halide platinate is provided. According to another embodiment, at least one platinum compound is provided which is selected from the group consisting of $PtX_2$, $[(C_2H_4)PtX_2]_2$, $M[(C_2H_4)PtX_3]$, $M_2[PtXA]$, $PtX_4$, $M_2[PtX_6]$, derivatives and isomers thereof, and mixtures thereof. In this case, X are each independently selected from the group consisting of F, Cl, Br, and I, advantageously Cl, Br, and I, in particular Cl and Br. And M are independently selected from the group consisting of alkali metals, advantageously lithium, sodium, or potassium, in particular sodium or potassium, alkaline earth metals, advantageously magnesium, calcium, strontium, or barium, in particular magnesium or calcium, and silver. In another variant of the method claimed, at least one platinum chloride or one chloridoplatinate is provided. In a further embodiment, at least one platinum compound is provided which is selected from the group consisting of $PtCl_2$, $[(C_2H_4)PtCl_2]_2$, $K[(C_2H_4)PtCl_3]$, $Na_2[PtCl_4]$, $K_2[PtCl_4]$, $PtCl_4$, $Na_2[PtCl_6]$, and $K_2[PtCl_6]$, derivatives and isomers thereof, and mixtures thereof. According to yet another variant, at least one platinum compound is provided which is selected from the group consisting of $PtCl_4$, $Na_2[PtCl_6]$, and $K_2[PtCl_6]$, derivatives and isomers thereof, and mixtures thereof. In yet another embodiment of the method, at least one platinum compound is provided which is selected from the group consisting of $Na_2[PtCl_6]$ and $K_2[PtCl_6]$, derivatives and isomers thereof, and mixtures thereof.

Another embodiment variant of the method for producing trimethylplatinum(IV) iodide provides that the at least one methyl Grignard compound comprises or is MeMgI. Depending on the selection of the other reaction conditions, such as the selection of the platinum compound or platinum compounds, the selection of the solvent $S_A$, the platinum concentration, the reaction temperature, and/or the reaction pressure, the batch size, the intended volume ratio of ether $S_E$: halogenated hydrocarbon $S_H$, the use of MeMgI may be advantageous for allowing better control of the course of the reaction, in particular the exothermicity.

In yet another variant, the aprotic polar solvent $S_A$ is chemically inert. In the context of the present invention, the term "inert solvent" means a solvent which is not chemically reactive under the respective process conditions. Under the respective reaction conditions, including the purification and/or isolation steps, the inert solvent therefore does not react with a potential reaction partner, in particular not with a reactant and/or an intermediate and/or a product and/or a by-product, and not with another solvent, air, or water.

In a further embodiment, the aprotic polar solvent $S_A$ has a boiling temperature $T_A$, wherein the boiling temperature $T_A$ is between 30° C. and 140° C. The boiling temperature $T_A$ is advantageously between 31° C. and 120° C., in particular between 32° C. and 110° C. or between 33° C. and 99° C. Thus, the solvent $S_A$ can be quantitatively removed, for example, by simply applying a negative pressure to the respective reaction vessel, optionally at a slightly increased temperature of the respective reaction mixture.

According to another embodiment of the method, the halogenated hydrocarbon $S_H$ is selected from the group consisting of alkyl halides and aromatic halogenated hydrocarbons. Advantageously, the halogenated hydrocarbon $S_H$ is a chlorinated hydrocarbon or a brominated hydrocarbon. In particular, the halogenated hydrocarbon $S_H$ is selected from the group consisting of dichloromethane, 1,1-dichloroethane, 1,2-dichloroethane, dibromomethane, 1,1-dibromoethane, 1,2-dibromoethane, chlorobenzene, and isomers thereof, and mixtures thereof. Another embodiment of the method for producing trimethylplatinum(IV) iodide provides that the ether $S_E$ is selected from the group consisting of tetrahydrofuran, methyl tetrahydrofuran, 1,4-dioxane, diethyl ether, methyl tert-butyl ether, di-n-propyl ether, diisopropyl ether, cyclopentyl methyl ether, and isomers thereof, and mixtures thereof. Advantageously, all of the aforementioned solvents are solvents usually used in the chemical industry. Moreover, said solvents have boiling temperatures <140° C., in part <110° C., or <100° C. A quantitative removal of said solvents is thus possible, for example, by simply applying a negative pressure to the respective reaction vessel, optionally at a slightly increased temperature of the respective reaction mixture.

In another embodiment of the method for producing trimethylplatinum(IV) iodide, the molar ratio of Pt metal: MeMgX:iodomethane is between 1:4.05:4.05 and 1:5.9: 5.9, or between 1:4.1:4.1 and 1:5.5: 5.5, or precisely 1:5:5. In a further embodiment variant of the method, a molar ratio MeMgX:iodomethane is between 1:1.5 and 1.5:1, or between 1:1.4 and 1.4:1, advantageously between 1:1.3 and 1.3:1, or between 1:1.2 and 1.2:1, in particular between 1:1.1 and 1.1:1 or precisely 1:1.

According to another embodiment of the method, the reaction comprises the following steps:
A. providing the at least one platinum compound and
B. reacting the at least one platinum compound from step A. with
   iodomethane
   and
   with the at least one methyl Grignard compound according to the general formula MeMgX.

Another variant of the method described herein provides that the reaction comprises the following steps:
i) providing the at least one platinum compound, in particular as a suspension or as a solid,
ii) adding the iodomethane,
and
iii) adding the at least one methyl Grignard compound according to the general formula MeMgX.

In this case, the at least one methyl Grignard compound usually reacts with the at least one platinum compound during and/or after step iii).

Another embodiment of the method provides that in step i), a suspension of the at least one platinum compound is provided in the halogenated hydrocarbon $S_H$, e.g., dichloromethane, or in a halogenated hydrocarbon or halogenated hydrocarbon mixture miscible therewith.

Alternatively, provision may be provided in the ether $S_E$, e.g., diethyl ether, or in an ether or ether mixture miscible therewith. The halogenated hydrocarbon $S_H$ may also constitute a solvent mixture, i.e., contain a plurality of halogenated hydrocarbons. The ether $S_E$ may also be a mixture of a plurality of ethers. Alternatively, the at least one platinum compound may be provided in a solvent mixture comprising one or more halogenated hydrocarbons and one or more ethers. In particular, the solvent mixture is miscible with or identical to the aprotic polar solvent $S_A$. Yet another variant of the method provides that the at least one platinum compound is provided as a suspension in an aprotic polar solvent miscible with the aprotic polar solvent $S_A$.

Iodomethane may be added as a solution in the ether $S_E$, for example di-n-propyl ether, or as an ether or ether mixture miscible therewith. Alternatively, the addition of the iodomethane in the halogenated hydrocarbon $S_H$, e.g., dibromomethane, or a halogenated hydrocarbon or halogenated hydrocarbon mixture miscible therewith is possible. The halogenated hydrocarbon $S_H$ may also constitute a mixture comprising a plurality of halogenated hydrocarbons. The ether $S_E$ may also be a mixture of a plurality of ethers. According to another variant of the method, the iodomethane is added in the aprotic polar solvent $S_A$ or in an aprotic polar solvent or solvent mixture miscible with the aprotic polar solvent $S_A$. Alternatively, the addition of the iodomethane in substance, i.e., as a liquid, is possible.

The methyl Grignard compound is usually added as a solution in the ether or ether mixture $S_E$ or an ether or ether mixture miscible therewith. The concentration of the Grignard solution used, i.e., the molar concentration of the methyl Grignard compound in the respective ether or ether mixture $S_E$ or an ether or ether mixture miscible therewith, is advantageously selected taking into account the remaining reaction conditions, such as the selection of the platinum compound or platinum compounds, the selection of further aprotic polar solvents or solvent mixtures used, in particular of the halogenated hydrocarbon or the halogenated hydrocarbon mixture $S_H$, of the reaction temperature, and/or of the reaction pressure, of the platinum concentration, of the batch size, of the intended volume ratio of ether $S_E$:halogenated hydrocarbon $S_H$.

The respective reaction vessel may also be loaded with the reactants, namely the at least one platinum compound, the methyl Grignard compound according to the general formula MeMgX, and the iodomethane, in a different order.

An alternative embodiment of the method thus provides that, in step ii), the at least one methyl Grignard compound according to the general formula MeMgX is added as a solution in the ether or ether mixture $S_E$ or an ether or ether mixture miscible therewith. In step iii), the addition of the iodomethane as a solution in the ether $S_E$, e.g., methyl ted-butyl ether, or an ether or ether mixture miscible therewith is added. Alternatively, the addition of the iodomethane in the halogenated hydrocarbon $S_H$, e.g., chlorobenzene, or in a halogenated hydrocarbon or halogenated hydrocarbon mixture miscible therewith is possible. The halogenated hydrocarbon $S_H$ may also constitute a solvent mixture comprising a plurality of halogenated hydrocarbons. The ether $S_E$ may also be a mixture of a plurality of ethers. According to another variant of the method, the iodomethane is added in the aprotic polar solvent $S_A$ or in an aprotic polar solvent or solvent mixture miscible with the aprotic polar solvent $S_A$. Alternatively, the addition of the iodomethane in substance, i.e., as a liquid, is possible.

In yet another variant of the method, the iodomethane and the at least one methyl Grignard compound according to the general formula MeMgX are added in a single step. The methyl Grignard compound may first be produced in situ in the ether or ether mixture $S_E$ or in an ether or ether mixture miscible therewith using a corresponding excess of iodomethane. Alternatively, the methyl Grignard compound may be used as a prefabricated and/or stored, optionally commercially available, solution in the ether or ether mixture $S_E$ or in an ether or ether mixture miscible therewith, wherein the intended quantity of iodomethane is added to this solution prior to the addition of the solution of the at least one methyl Grignard compound. Alternatively, the methyl Grignard compound and the iodomethane are added separately but simultaneously.

The phrase "produced in situ" as used in the present invention means that the reactants required for the synthesis of a compound to be produced in this way are reacted in a suitable stoichiometry in a solvent or solvent mixture and the resulting product is not isolated. Instead, the solution or the suspension, which comprises the compound produced in situ, is generally reused directly, i.e., without isolation and/or further purification.

A further embodiment of the method provides that the at least one methyl Grignard compound according to the general formula MeMgX is provided in step i) and the at least one platinum compound is added, in particular in the form of a suspension or in substance, i.e., as a solid, in step ii). The methyl Grignard compound may first be produced in situ in the ether or ether mixture $S_E$ or in an ether or ether mixture miscible therewith using a corresponding excess of iodomethane. Alternatively, the methyl Grignard compound may be used as a prefabricated and/or stored, optionally commercially available, solution in the ether or ether mixture $S_E$ or in an ether or ether mixture miscible therewith, wherein the intended quantity of iodomethane is added to this solution prior to the addition of the solution of the at least one methyl Grignard compound. In yet another variant, the methyl Grignard compound and the iodomethane are added separately but simultaneously. Alternatively or additionally, the iodomethane may be added, in particular in portions, before and/or during and/or after the addition of the at least one platinum compound.

According to another variant of the method, the at least one platinum compound is provided or added using a dosing device, in particular as a solid via a funnel or as a suspension by dropwise addition or injection. Alternatively or additionally, a shut-off valve and/or a stop valve can be provided in a supply line of the reaction vessel.

In a further embodiment of the method, it is provided that the at least one methyl Grignard compound according to the general formula MeMgX and/or the iodomethane are added or provided using a dosing device. The addition can take place, for example, by dropwise addition or injection. Alternatively or additionally, a shut-off valve and/or a stop valve can be provided in a supply line of the reaction vessel.

Furthermore, a method variant is provided in which the reaction of the at least one platinum compound with the iodomethane and the methyl Grignard compound according to the general formula MeMgX is carried out in the aprotic polar solvent $S_A$ at a temperature $T_U$. In this case, the temperature $T_U$ is between –10° C. and 140° C., advantageously between –5° C. and 120° C., in particular between 0° C. and 110° C. or between 0.5° C. and 100° C. It is particularly advantageous if the reaction is carried out at a temperature $T_U$ between 1° C. and 99° C. In an especially energy-saving variant of the method, the temperature $T_U$ is between 10° C. and 50° C., in particular between 15° C. and 45° C., e.g., 20° C., 25° C., 30° C., 35° C., or 40° C.

Yet another embodiment of the method provides that, during the addition and/or after the addition of the iodomethane and/or the at least one methyl Grignard compound according to the general formula MeMgX to the at least one platinum compound, a temperature $T_C$ is between –10° C. and 120° C., advantageously between –5° C. and 110° C., in particular between 0° C. and 100° C. It is particularly advantageous, during the addition and/or after the addition of the iodomethane and/or the at least one methyl Grignard compound, for the temperature Tc to be between 0.5° C. and 99° C., advantageously between 1° C. and 90° C., in particular between 2° C. and 80° C. In a particularly energy-saving variant of the method, during the addition and/or after the addition of the iodomethane and/or the at least one methyl Grignard compound according to the general formula MeMgX, the temperature $T_C$, is between 10° C. and 50° C., in particular between 15° C. and 45° C., e.g., 20° C., 25° C., 30° C., 35° C., or 40° C. According to a further variant of the method, the aforementioned temperature ranges are likewise provided if, as described above, the loading of the respective reaction vessel with the reactants, i.e., the addition of the reactants, i.e., of the at least one platinum compound, the iodomethane, and the at least one methyl Grignard compound, is carried out in a different order. In particular, even if the at least one methyl Grignard compound according to the general formula MeMgX is provided in step i) and the at least one platinum compound is added in step ii), in particular in the form of a suspension or in substance, i.e., as a solid.

In another embodiment of the method, the temperature $T_U$ and the temperature $T_C$ are regulated and/or controlled using a heat transfer medium W. For this purpose, a cryostat can be used, for example, which contains the heat transfer medium W, which ideally can function both as a coolant and as a heating medium. The use of the heat transfer medium W allows any deviations in the temperature $T_U$ from a defined setpoint value $T_{S1}$ and deviations in the temperature $T_C$ from a defined setpoint value $T_{S2}$ to be largely quenched or compensated. The typical device deviations make it almost impossible to realize a constant temperature $T_U$ and $T_C$. By using the heat transfer medium W, the reaction of the at least one platinum compound with the iodomethane and the methyl Grignard compound according to the general formula MeMgX may be carried out in the aprotic polar solvent $S_A$, at least, however, in a preselected temperature range or in a plurality of preselected temperature ranges. For example, as a function of the other reaction parameters, such as the selection of the platinum compound or platinum compounds, the concentration of the Grignard solution, the selection of the solvent $S_A$, the platinum concentration, the reaction pressure, the batch size, the intended volume ratio of ether $S_E$:halogenated hydrocarbon $S_H$, it may be advantageous to create a temperature program for even better control of the course of the reaction or of the exothermicity.

For example, during a first phase of the reaction of the at least one platinum compound with the iodomethane and the methyl Grignard compound, a lower temperature or a lower temperature range can be selected than in a second phase of the reaction of the at least one platinum compound with the iodomethane and the methyl Grignard compound. It is also possible to provide more than two phases of the reaction and/or of the addition and thus more than two preselected temperatures or temperature ranges. Depending on the selection of the other reaction conditions, such as the selection of the platinum compound or platinum compounds, the concentration of the Grignard solution, the selection of the solvent $S_A$, the platinum concentration, the reaction pressure, the batch size, the intended volume ratio of ether $S_E$: halogenated hydrocarbon $S_H$, it may be favorable to increase the temperature Tc during the addition and/or after the addition of one of the reactants using the heat transfer medium W. In this way, it can optionally be ensured that the reaction takes place quantitatively. The increase in the temperature $T_U$ using the heat transfer medium W may last, for example, between 10 min and 24 h.

Another embodiment of the method for producing trimethylplatinum(IV) iodide provides that the reaction takes place in an inert gas atmosphere.

In yet another embodiment of the method, a step is carried out after the reaction, which step comprises quenching unreacted methyl Grignard compound according to the general formula MeMgX.

In the context of the present invention, the term "quenching" refers to the deactivating of one or more unreacted methyl Grignard compounds according to the general formula MeMgX. Reagents provided for this purpose are referred to below as "quenchers." One embodiment of the method provides that a quencher is selected from the group consisting of alkyl halides, ketones, alcohols, water, mineral acids, and organic acids, in particular carboxylic acids. Advantageously, the quencher is selected from the group consisting of acetone, 1-bromo-2-chloroethane, 1-bromo-2-fluoroethane, and iodomethane. In particular, the quencher comprises or is acetone and/or iodomethane. If, for example, an excess of iodomethane in relation to the methyl Grignard compound MeMgX is used, the use of a further quencher, in particular mentioned above, may optionally be partially or completely dispensed with.

If trimethylplatinum(IV) iodide is produced in accordance with the method described herein, only the desired target compound trimethylplatinum(IV) iodide, the solvent $S_A$, and defined, easily separable by-products, such as NaCl, KCl, $MgCl_2$, and $MgI_2$, are present after the reaction of the at least one platinum compound with the iodomethane and the at least one methyl Grignard compound according to the general formula MeMgX. The suspension comprising the target compound trimethylplatinum(IV) iodide in solution may be reacted directly with one or more further reactants, for example with cyclopentadienyl sodium.

Alternatively, after the reaction, a step is carried out which comprises an isolation of trimethylplatinum(IV) iodide:
- as a solution comprising trimethylplatinum(IV) iodide and the aprotic polar solvent $S_A$, or
- as a solid.

In a further variant of the method, the isolation comprises a filtration step. A plurality of filtration steps may also be provided, optionally also one or more filtrations over a cleaning medium, such as activated carbon or silica, e.g., Celite®.

During the isolation as a solution or as a solid, the easy separability of the salts produced as by-products, in particular magnesium salts and sodium and/or potassium salts, for example by filtration, optionally with filtration aids, e.g., Celite®, and/or centrifugation and/or decantation may be exploited. This may also be substantiated by the advantageous selection of the aprotic polar solvent $S_A$. For example, if a diethyl ether/dichloromethane in a ratio of approx. 1:1 (v/v) is used as solvent, magnesium, potassium, and sodium salts in particular precipitate completely or almost quantitatively, while the target compound trimethylplatinum(IV) iodide remains in solution. Contamination of the trimethylplatinum(IV) iodide by the resulting salt load is thus advantageously significantly reduced or prevented. The filtrate, centrifugate, or decantate comprising the platinum(IV) compound in solution may be stored and/or reacted in situ, i.e., without prior isolation and/or purification, with one or more further reactants.

Alternatively, the trimethylplatinum(IV) iodide may be isolated as a solid, for example, by means of a simple filtration, optionally with filtration aid, e.g., Celite®, and/or by centrifugation and/or decantation, followed by the removal of all volatile constituents, such as solvent and unreacted iodomethane. It is particularly advantageous that magnesium salts in particular, such as $MgI_2$ and $MgCl_2$, and sodium and potassium salts, including optionally small quantities of unreacted, suspended platinum(II) and/or platinum(IV) salts, can be removed easily and approximately quantitatively, preferably quantitatively, by a filtration step and/or by centrifugation and/or decantation.

The isolation of trimethylplatinum(IV) iodide as a solution or as a solid may comprise further method steps, such as the reduction of the mother liquor volume, i.e., concentration, for example by means of "bulb-to-bulb," the addition of a solvent and/or a solvent exchange to precipitate the product from the mother liquor and/or to remove impurities and/or reactants, washing, e.g., with diluted hydrochloric acid, water, and/or acetone, and drying of the product. The aforementioned steps may each be provided in different orders and frequencies.

Advantageously, the filtrate, centrifugate, or decantate may be subjected to optionally provided purification and/or isolation steps which may be carried out rapidly and without complication and without special effort in terms of preparation, in particular without ensuring an inert gas atmosphere. Overall, the purification and/or isolation of the target compound trimethylplatinum(IV) iodide is relatively simple and cost-effective.

In general, the end product may still contain residues of solvents or salts precipitated as by-products. Trimethylplatinum(IV) iodide isolated as a solid has at least a purity of 97%, advantageously of more than 97%, in particular of more than 98% or 99%. Even in the case of upscaling to industrial scale, the reproducible yield is usually >90%, in particular as a function of the selection of the platinum compound or platinum compounds, the methyl Grignard compound, and the solvent mixture.

The object is also achieved by a solution comprising trimethylplatinum(IV) iodide and an aprotic polar solvent $S_A$ comprising an ether $S_E$ and a halogenated hydrocarbon $S_H$, obtained or obtainable according to a method for producing trimethylplatinum(IV) iodide in accordance with one of the exemplary embodiments described above.

The aprotic polar solvent $S_A$ may also be a solvent mixture containing more than one ether $S_E$ and/or more than one halogenated hydrocarbon $S_H$. One embodiment of the solution claimed herein provides that the at least one ether $S_E$ and the at least one halogenated hydrocarbon $S_H$ are miscible. The aprotic polar solvent $S_A$ may comprise further aprotic polar solvents which are miscible with the at least one ether $S_E$ and the at least one halogenated hydrocarbon $S_H$. In the context of the solution claimed herein, two solvents are referred to as miscible if they are miscible at least during the respective production and storage of the solution claimed herein, that is to say, are not present as two phases.

In a variant of the solution claimed herein, the aprotic polar solvent $S_A$ is chemically inert. The term "inert solvent" is already defined above.

According to a further embodiment of the claimed solution, the aprotic polar solvent $S_A$ has a boiling temperature $T_A$, wherein the boiling temperature $T_A$ is between 30° C. and 140° C. The boiling temperature $T_A$ is advantageously between 31° C. and 120° C., in particular between 32° C. and 110° C. or between 33° C. and 99° C. Thus, the solvent $S_A$ may be quantitatively removed, for example, by simply applying a negative pressure to the respective storage or reaction vessel, optionally at a slightly increased temperature of the respective solution or of the respective reaction mixture.

According to another embodiment of the solution comprising trimethylplatinum(IV) iodide and the aprotic polar solvent $S_A$, the halogenated hydrocarbon $S_H$ is selected from the group consisting of alkyl halides and aromatic halogenated hydrocarbons. Advantageously, the halogenated hydrocarbon $S_H$ is a chlorinated hydrocarbon or a brominated hydrocarbon. In particular, the halogenated hydrocarbon $S_H$ is selected from the group consisting of dichloromethane, 1,1-dichloroethane, 1,2-dichloroethane, dibromomethane, 1,1-dibromoethane, 1,2-dibromoethane, chlorobenzene, and isomers thereof, and mixtures thereof. Another embodiment of the claimed solution provides that the ether $S_E$ is selected from the group consisting of tetrahydrofuran, methyl tetrahydrofuran, 1,4-dioxane, diethyl ether, methyl tert-butyl ether, di-n-propyl ether, diisopropyl ether, cyclopentyl methyl ether, and isomers thereof, and mixtures thereof. Advantageously, all of the aforementioned solvents are solvents usually used in the chemical industry. Moreover, said solvents have boiling temperatures <140° C., in part <110° C., or <100° C. A quantitative removal of said solvents is thus possible, for example, by simply applying a negative pressure to the respective storage or reaction vessel, optionally at a slightly increased temperature of the respective solution or respective reaction mixture.

The solutions claimed, comprising trimethylplatinum(IV) iodide and the aprotic polar solvent $S_A$, are characterized in particular by the fact that they can be produced in a simple, cost-effective and reproducible manner by means of the method described above. The solutions have a very high degree of purity, wherein they are in particular substantially free of impurities by magnesium, sodium, and potassium salts, and elemental iodine. The definitions given above apply to the terms "substantially free of impurities by magnesium salts," "substantially free of impurities by potassium salts," "substantially free of impurities by sodium salts," and "substantially free of impurities by elemental iodine." The yields of the compound trimethylplatinum(IV) iodide in solution are good to very good. The formation of by-products that are separable with difficulty or not at all, in particular elemental iodine, is advantageously reduced or completely avoided. Based on the solvent mixture selected, salt loads produced, e.g., in the form of NaCl, KCl, $MgCl_2$, or $MgI_2$, may advantageously be separated quantitatively or almost quantitatively. Consequently, the purity of the solutions thus obtained or obtainable and comprising trimethylplatinum(IV) iodide and the aprotic polar solvent $S_A$ satisfies the requirements set forth in the areas of catalysts, precatalysts, and production of precursors for chemical vapor deposition processes. In addition, the method described above can also be carried out on an industrial scale, wherein comparable yields, including space-time yields, and purities are achieved.

Furthermore, the object is achieved by trimethylplatinum (IV) iodide, obtained or obtainable according to a method for producing trimethylplatinum(IV) iodide in accordance with one of the exemplary embodiments described above.

In one embodiment of the trimethylplatinum(IV) iodide, the magnesium content is ≤500 ppm, advantageously ≤300 pm. A further embodiment of the trimethylplatinum(IV) iodide provides that the potassium content is ≤100 ppm, advantageously ≤50 ppm. A further variant of the trimethylplatinum(IV) iodide provides that the sodium content is ≤100 ppm, advantageously ≤50 ppm.

Moreover, the trimethylplatinum(IV) iodide claimed herein, obtained or obtainable according to a method in accordance with one of the exemplary embodiments described above, is present in particular as an off-white or white, optionally at least semi-crystalline, powder or in the form of off-white or white crystals.

The claimed trimethylplatinum(IV) iodide is characterized in particular in that it can be produced in a simple, cost-effective and reproducible manner. The platinum(IV) compound is obtained with a very high degree of purity by means of the method described above, in particular substantially free of impurities by magnesium, potassium, or sodium salts, and elemental iodine, and at good to very good yields, including space-time yields. The formation of by-products that are separable with difficulty or not at all, in particular elemental iodine, is advantageously reduced or completely avoided. Based on the solvent mixture selected, salt loads produced, e.g., in the form of NaCl, KCl, $MgCl_2$, or $MgI_2$, may advantageously be separated quantitatively or almost quantitatively. Therefore, the purity of the trimethylplatinum(IV) iodide obtained or obtainable in the form of a solid satisfies the requirements placed on catalysts, precatalysts, and reactants for producing precursors for chemical vapor deposition processes. In addition, the method described above can also be carried out on an industrial scale, wherein comparable yields, including space-time yields, and purities of the target compound are achieved.

The definitions given above apply to the terms "substantially free of impurities by magnesium salts," "substantially free of impurities by potassium salts," "substantially free of impurities by sodium salts," and "substantially free of impurities by elemental iodine."

Moreover, the object is achieved by the use of
a solution comprising trimethylplatinum(IV) iodide and an aprotic polar solvent $S_A$ comprising an ether $S_E$ and a halogenated hydrocarbon $S_H$,
or
trimethylplatinum(IV) iodide,
each obtained or obtainable according to a method for producing trimethylplatinum(IV) iodide in accordance with one of the exemplary embodiments described above as a reactant for producing platinum(IV) compounds.

The aforementioned use is a method for producing platinum(IV) compounds using
a solution comprising trimethylplatinum(IV) iodide and an aprotic polar solvent $S_A$ comprising an ether $S_E$ and a halogenated hydrocarbon $S_H$, or
trimethylplatinum(IV) iodide,
each obtained or obtainable according to a method for producing trimethylplatinum(IV) iodide in accordance with one of the exemplary embodiments described above, comprising the steps of:
a) providing the trimethylplatinum(IV) iodide or the solution comprising trimethylplatinum(IV) iodide and the aprotic polar solvent $S_A$,
and
b) synthesizing the platinum(IV) compound using the trimethylplatinum(IV) iodide present in solution as a reactant.

The method for producing platinum(IV) compounds described herein can be carried out as a discontinuous process or as a continuous process.

According to one embodiment of the method for producing platinum(IV) compounds claimed herein, the provision of the trimethylplatinum(IV) iodide, in particular of the solution comprising trimethylplatinum(IV) iodide and the aprotic polar solvent SA, comprises in step a) an in-situ production of the trimethylplatinum(IV) iodide according to a method for producing trimethylplatinum(IV) iodide in accordance with one of the embodiments described above. The expression "in-situ production" means that the reactants required for the synthesis of a compound to be produced in this way are reacted in a suitable stoichiometry in a solvent or solvent mixture and the resulting product is not isolated. Instead, the solution or the suspension, which comprises the compound produced in situ, is generally reused directly, i.e., without isolation and/or further purification.

The aprotic polar solvent $S_A$ may also be a solvent mixture containing more than one ether $S_E$ and/or more than one halogenated hydrocarbon $S_H$. An embodiment of the use claimed herein of trimethylplatinum(IV) iodide or of a solution comprising trimethylplatinum(IV) iodide and the aprotic polar solvent $S_A$, or of the method using trimethylplatinum(IV) iodide or of the aforementioned solution for producing platinum(IV) compounds provides that the at least one ether $S_E$ and the at least one halogen hydrocarbon $S_H$ are miscible. The aprotic polar solvent $S_A$ may comprise further aprotic polar solvents which are miscible with the at least one ether $S_E$ and the at least one halogenated hydrocarbon $S_H$. In the context of the use described herein or of the method claimed herein, two solvents are referred to as miscible if they are miscible at least during the respective production and storage of the solution claimed herein, that is to say, are not present as two phases.

According to one embodiment of the use claimed herein or of the method claimed herein, the aprotic polar solvent $S_A$ is chemically inert. The term "inert solvent" is already defined above.

In a further embodiment of the aforementioned use or method for producing platinum(IV) compounds, the aprotic polar solvent $S_A$ has a boiling temperature $T_A$, wherein the boiling temperature $T_A$ is between 30° C. and 140° C. The boiling temperature $T_A$ is advantageously between 31° C. and 120° C., in particular between 32° C. and 110° C. or between 33° C. and 99° C. Thus, the solvent $S_A$ can be quantitatively removed before and/or during and/or after production of the respective platinum(IV) compound, for example, by simply applying a negative pressure to the respective storage or reaction vessel, optionally at a slightly increased temperature of the respective solution or of the respective reaction mixture. In the simplest case and optimally from an economical and ecological perspective, the solvent $S_A$ functions as a solvent during the method for producing the respective platinum(IV) compound or is at least a miscible component of the solvent used for this purpose.

According to another embodiment of the aforementioned use or method for producing platinum(IV) compounds, the halogenated hydrocarbon $S_H$ is selected from the group consisting of alkyl halides and aromatic halogenated hydrocarbons. Advantageously, the halogenated hydrocarbon $S_H$ is a chlorinated hydrocarbon or a brominated hydrocarbon. In particular, the halogenated hydrocarbon $S_H$ is selected from the group consisting of dichloromethane, 1,1-dichloroethane, 1,2-dichloroethane, dibromomethane, 1,1-dibromoethane, 1,2-dibromoethane, chlorobenzene, and isomers thereof, and mixtures thereof. Another embodiment of the aforementioned use or method for producing platinum(IV) compounds provides that the ether $S_E$ is selected from the group consisting of tetrahydrofuran, methyl tetrahydrofuran, 1,4-dioxane, diethyl ether, methyl tert-butyl ether, di-n-propyl ether, diisopropyl ether, cyclopentyl methyl ether, and isomers thereof, and mixtures thereof. Advantageously, all of the aforementioned solvents are solvents usually used in the chemical industry. Moreover, said solvents have boiling temperatures <140° C., in part <110° C., or <100° C. A quantitative removal of said solvents before and/or during and/or after the production of the respective platinum (IV) compound is thus possible, for example, by simply applying a negative pressure to the respective storage or reaction vessel, optionally at a slightly increased temperature of the respective solution or respective reaction mixture.

By means of the use of trimethylplatinum(IV) iodide claimed herein or of the method described herein for producing platinum(IV) compounds using trimethylplatinum (IV) iodide as a solid or dissolved in the polar aprotic solvent $S_A$, each obtained or obtainable according to a method for producing trimethylplatinum(IV)iodide according to one of the embodiments described above, a plurality of platinum (IV) compounds can be produced comparatively inexpensively, easily and quickly with a very high degree of purity and good to very good yields. Examples of such platinum (IV) compounds are, in particular, (cyclopentadienyl)trimethylplatinum(IV) and its derivatives, such as (methylcyclopentadienyl)trimethylplatinum(IV), (ethylcyclopentadienyl) trimethylplatinum(IV), (iso-propylcyclopentadienyl) trimethylplatinum(IV), and (fed-butylcyclopentadienyl) trimethylplatinum(IV). Due to their very high degree of purity, the platinum(IV) compounds thus obtainable or obtained are in particular suitable for use as precursors in chemical vapor deposition processes for producing high-purity platinum layers or platinum-containing layers. Advantageously, the aforementioned platinum(IV) compounds can also be readily prepared on an industrial scale, with a very high degree of purity and at good to very good yields, using the trimethylplatinum(IV) iodide obtained or obtainable according to the method described above.

Furthermore, the object is achieved by platinum(IV) compounds obtained or obtainable according to a method for producing platinum(IV) compounds in accordance with one of the exemplary embodiments described above. The method is carried out using trimethylplatinum(IV) iodide as a solid or a solution, comprising trimethylplatinum(IV) iodide and an aprotic polar solvent $S_A$ comprising an ether $S_E$ and a halogenated hydrocarbon $S_H$, each obtained or obtainable according to a method for producing trimethylplatinum(IV) iodide in accordance with one of the previously described embodiments.

The platinum(IV) compounds obtained or obtainable in this way are, for example, (cyclopentadienyl)trimethylplatinum(IV) and its derivatives, such as (methylcyclopentadienyl)trimethyl platinum (IV), (ethylcyclopentadienyl)trimethylplatinum (IV), (iso-propylcyclopentadienyl)trimethyl platinum (IV), and (tert-butylcyclopentadienyl)trimethylplatinum(IV). It is particularly advantageous that the aforementioned platinum(IV) compounds and a plurality of further platinum(IV) compounds can be prepared comparatively cost-effectively, easily, and quickly with a very high degree of purity and at good to very good yields by means of the method described above for producing platinum(IV) compounds using trimethylplatinum(IV) iodide as a solid or as a solution comprising trimethylplatinum(IV) iodide and the aprotic polar solvent $S_A$, each obtained or obtainable according to a method for producing trimethylplatinum(IV) iodide in accordance with one of the embodiments described above. Due to their high degree of purity, the platinum(IV) compounds obtainable or obtained in this way are in particular suitable for use as precursors in chemical vapor deposition processes for producing high-purity platinum layers or platinum-containing layers. Advantageously, the aforementioned platinum(IV) compounds can also be readily prepared on an industrial scale, with a very high degree of purity and at good to very good yields, using the trimethylplatinum(IV) iodide obtained or obtainable according to the method described above.

Furthermore, the object is achieved by the use of
a solution comprising trimethylplatinum(IV) iodide and an aprotic polar solvent $S_A$ comprising an ether $S_E$ and a halogenated hydrocarbon $S_H$,
or
trimethylplatinum(IV) iodide,
each obtained or obtainable according to a method for producing trimethylplatinum(IV) iodide in accordance with one of the exemplary embodiments described above, as a solution containing a catalyst or precatalyst or as a catalyst or as a precatalyst in a chemical reaction.

The aforementioned use is a method for carrying out a chemical reaction using
a solution comprising trimethylplatinum(IV) iodide and an aprotic polar solvent $S_A$ comprising an ether $S_E$ and a halogenated hydrocarbon $S_H$,
or
trimethylplatinum(IV) iodide,
each obtained or obtainable according to a method for producing trimethylplatinum(IV) iodide in accordance with one of the exemplary embodiments described above, comprising the steps of:
a) providing the trimethylplatinum(IV) iodide or the solution comprising trimethylplatinum(IV) iodide and the aprotic polar solvent $S_A$,
and
b) carrying out the chemical reaction using the trimethylplatinum(IV) iodide present as a solid or in solution as a catalyst or as a precatalyst.

The method for carrying out a chemical reaction described herein can be carried out as a discontinuous process or as a continuous process.

According to one embodiment of the method claimed herein for carrying out a chemical reaction, the provision of the trimethylplatinum(IV) iodide, in particular the solution comprising trimethylplatinum(IV) iodide and the aprotic polar solvent $S_A$, comprises in step a) an in-situ production of the trimethylplatinum(IV) iodide according to a method for producing trimethylplatinum(IV) iodide in accordance with one of the embodiments described above. The expression "in-situ production" is already defined above.

The aprotic polar solvent $S_A$ may also be a solvent mixture containing more than one ether $S_E$ and/or more than one halogenated hydrocarbon $S_H$. An embodiment of the use claimed herein of trimethylplatinum(IV) iodide or of a solution comprising trimethylplatinum(IV) iodide and the aprotic polar solvent $S_A$, or of the method for carrying out a chemical reaction using trimethylplatinum(IV) iodide or the aforementioned solution provides that the at least one ether $S_E$ and the at least one halogenated hydrocarbon $S_H$ are miscible. The aprotic polar solvent $S_A$ may comprise further aprotic polar solvents which are miscible with the at least one ether $S_E$ and the at least one halogenated hydrocarbon $S_H$. In the context of the use described herein or of the method claimed herein, two solvents are referred to as miscible if they are miscible at least during the respective production and storage of the solution claimed herein, that is to say, are not present as two phases.

According to one embodiment of the use claimed herein or of the method claimed herein, the aprotic polar solvent $S_A$ is chemically inert. The term "inert solvent" is already defined above.

In a further embodiment of the aforementioned use or method for carrying out a chemical reaction, the aprotic polar solvent $S_A$ has a boiling temperature $T_A$, wherein the boiling temperature $T_A$ is between 30° C. and 140° C. The boiling temperature $T_A$ is advantageously between 31° C. and 120° C., in particular between 32° C. and 110° C. or between 33° C. and 99° C. Thus, the solvent $S_A$ can be quantitatively removed before and/or during and/or after carrying out the chemical reaction, for example, by simply applying a negative pressure to the respective storage or reaction vessel, optionally at a slightly increased temperature of the respective solution or of the respective reaction mixture. In the simplest case, and optimally from an economical and ecological perspective, the solvent $S_A$ functions as a solvent during the chemical reaction to be carried out in a platinum-catalyzed manner or is at least a miscible component of the solvent used for this purpose.

According to another embodiment of the aforementioned use or method for carrying out a chemical reaction, the halogenated hydrocarbon $S_H$ is selected from the group consisting of alkyl halides and aromatic halogenated hydrocarbons. Advantageously, the halogenated hydrocarbon $S_H$ is a chlorinated hydrocarbon or a brominated hydrocarbon. In particular, the halogenated hydrocarbon $S_H$ is selected from the group consisting of dichloromethane, 1,1-dichloroethane, 1,2-dichloroethane, dibromomethane, 1,1-dibromoethane, 1,2-dibromoethane, chlorobenzene, and isomers thereof, and mixtures thereof. Another embodiment of the method for carrying out a chemical reaction provides that the ether $S_E$ is selected from the group consisting of tetrahydrofuran, methyl tetrahydrofuran, 1,4-dioxane, diethyl ether, methyl tert-butyl ether, di-n-propyl ether, diisopropyl ether, cyclopentyl methyl ether, and isomers thereof, and mixtures thereof. Advantageously, all to of the aforementioned solvents are solvents usually used in the chemical industry. Moreover, said solvents have boiling temperatures <140° C., in part <110° C., or <100° C. A quantitative removal of said solvents before and/or during and/or after carrying out the chemical reaction is thus possible, for example, by simply applying a negative pressure to the respective storage or reaction vessel, optionally at a slightly increased temperature of the respective solution or respective reaction mixture.

According to one embodiment of the use claimed herein of trimethylplatinum(IV) iodide or of the method for carrying out a chemical reaction using trimethylplatinum(IV)

iodide as a catalyst or precatalyst, the trimethylplatinum(IV) iodide is monomerized after the provision of the trimethylplatinum(IV) iodide (cf. step a)). The term "monomerization" refers to a provision of monomeric, soluble, and catalytically active Me$_3$PtI. Monomerization is usually achieved by thermal decomposition of the trimethylplatinum (IV) iodide, which is usually present as an oligomer, e.g., as a dimer or tetramer.

In yet another embodiment of the use claimed herein or of the method claimed herein for carrying out a chemical reaction using trimethylplatinum(IV) iodide, the chemical reaction is an addition reaction to a carbon-carbon double bond, wherein the trimethylplatinum(IV) iodide is used as a precatalyst. In a further variant of the claimed use or of the claimed method, the addition reaction is a hydrosilylation of a carbon-carbon double bond.

In the use claimed herein or the method claimed herein for carrying out a chemical reaction, trimethylplatinum(IV) iodide can be used as a solid or as a solution comprising trimethylplatinum(IV) iodide and the aprotic polar solvent S$_A$, each obtained or obtainable according to a method for producing trimethylplatinum(IV) iodide in accordance with one of the embodiments described above. Due to its very high degree of purity, the trimethylplatinum(IV) iodide thus obtainable or obtained is suitable for use as a precatalyst or catalyst in a plurality of platinum-catalyzed reactions. In particular, the trimethylplatinum(IV) iodide is substantially free of impurities by magnesium, sodium, and potassium salts, and elemental iodine, as explained above. The definitions given above apply to the terms "substantially free of impurities by magnesium salts," "substantially free of impurities by potassium salts," "substantially free of impurities by sodium salts," and "substantially free of impurities by elemental iodine." It is particularly advantageous that trimethylplatinum(IV) iodide can be prepared relatively cost-effectively, simply, and quickly with good to very good yields, including space-time yields, by means of the method described above, on an industrial scale as well. Thus, the use of trimethylplatinum(IV) iodide claimed herein or the method described herein for carrying out a chemical reaction using trimethylplatinum(IV) iodide, obtained or obtainable according to a method for producing trimethylplatinum(IV) iodide in accordance with one of the embodiments described above, can be carried out easily, quickly, and comparatively cost-effectively, at least with regard to the provision (cf. step a)) of the trimethylplatinum(IV) iodide or of the solution comprising trimethylplatinum(IV) iodide and the aprotic polar solvent S$_A$.

In addition, the object is achieved by the use of a platinum(IV) compound, obtained or obtainable according to a method for producing platinum(IV) compounds in accordance with one of the embodiments described above, as precursor compound for producing a platinum layer or a platinum-containing layer, in particular on at least one surface of a substrate.

The aforementioned use is a method for producing
i. at least one platinum layer
or
ii. at least one platinum-containing layer,
on at least one surface of a substrate using a platinum(IV) compound, obtained or obtainable according to a method for producing platinum(IV) compounds in accordance with one of the exemplary embodiments described above, comprising the steps of:

a) providing the platinum(IV) compound,
and
b) depositing
i. the at least one platinum layer
or
ii. the at least one platinum-containing layer
on the at least one surface of the substrate using the platinum(IV) compound as precursor compound.

In step a), the provision of one or more platinum(IV) compounds may be provided. Furthermore, in step a), one or more platinum(IV) compounds may be provided independently of one another as a solid or as a solution comprising one or more platinum(IV) compounds.

At this point as well as in the following, the specification of an exact stoichiometry of the depositable platinum-containing layers or films has been dispensed with. The term "layer" is synonymous with the expression "film" and does not make any statement regarding the layer thickness or the film thickness.

Due to their very high degree of purity, the platinum(IV) compounds used are particularly suitable as precursor compounds for producing high-quality platinum layers or platinum-containing layers on a surface of a substrate. This is, in particular, attributable to their production based on a method in accordance with one of the embodiments described above, namely using trimethylplatinum(IV) iodide, obtained or obtainable according to a method for producing trimethylplatinum(IV) iodide in accordance with one of the exemplary embodiments described above. This is because trimethylplatinum(IV) iodide obtained or obtainable in this way is substantially free of impurities by magnesium, sodium, and potassium salts, and elemental iodine, which are disadvantageous for the coating process and thus for the performance of the coated substrates. The definitions given above apply to the terms "substantially free of impurities by magnesium salts," "substantially free of impurities by potassium salts," "substantially free of impurities by sodium salts," and "substantially free of impurities by elemental iodine." In addition, the platinum(IV) compounds to be provided according to step a) can be prepared according to a method for producing such compounds in accordance with one of the embodiments described above in a particularly simple and comparatively cost-effective manner, which facilitates their use on an industrial scale.

In one embodiment of the use described herein or of the method described herein for producing a platinum layer or a platinum-containing layer on a surface of a substrate, the platinum(IV) compound provided in step a) is selected from the group consisting of (methylcyclopentadienyl)trimethylplatinum (IV), (ethylcyclopentadienyl)trimethylplatinum (IV), (iso-propylcyclopentadienyl)trimethylplatinum (IV), and (tert-butylcyclopentadienyl)trimethyl platinum (IV).

In another embodiment of the use claimed herein or of the method claimed herein for producing a platinum layer or a platinum-containing layer, the deposition of the platinum layer or of the platinum-containing layer in step b) takes place by means of a vapor deposition process. In particular, the platinum layer or the platinum-containing layer is deposited by means of an ALD process or an MOCVD process, in particular an MOVPE process.

The substrate may, for example, comprise one or more base metals or be produced from one or more base metals. Alternatively or additionally, the substrate may comprise one or more non-metallic materials or consist entirely of one or more non-metallic materials. Corundum foils or thin metallic foils can, for example, be used as the substrate. The substrate itself can be part of a component. In one embodiment of the aforementioned use of a platinum(IV) compound as precursor compound for producing a platinum layer or a platinum-containing layer, or in one embodiment of the method for producing a platinum layer or a platinum-containing layer on a surface of a substrate, the substrate is a wafer. The wafer may comprise silicon, silicon carbide, germanium, gallium arsenide, indium phosphide, a glass, such as $SiO_2$, and/or a plastic, such as silicone, or consist entirely of one or more such materials. The wafer can also have one or more wafer layers, each having one surface. The production of the platinum layer or of the platinum-containing layer may be provided on the surface of one or more wafer layers.

Due to the very high degree of purity of the platinum layer or of the platinum-containing layer, substrates obtained or obtainable by means of the use claimed herein or the method described herein and comprising a platinum layer or a platinum-containing layer can be used particularly well for the production of an electronic component, in particular of an electronic semiconductor component, or of an electrode for a fuel cell. In the latter case, the platinum layer or the platinum-containing layer functions as a catalytic layer.

The object is furthermore achieved by a substrate comprising at least
i. one platinum layer
Or
ii. one platinum-containing layer
on at least one surface,
wherein the platinum layer or the platinum-containing layer
is produced using a platinum(IV) compound obtained or obtainable according to a method for producing platinum (IV) compounds in accordance with one of the exemplary embodiments described above.

The substrate may, for example, comprise one or more base metals or be manufactured from one or more base metals. Alternatively or additionally, the substrate may comprise one or more non-metallic materials or consist entirely of one or more non-metallic materials. Corundum foils or thin metallic foils can, for example, be used as the substrate. The substrate itself can be part of a component. In one embodiment, the substrate is a wafer. The wafer may comprise silicon, silicon carbide, germanium, gallium arsenide, indium phosphide, a glass, such as $SiO_2$, and/or a plastic, such as silicone, or consist entirely of one or more such materials. The wafer can also have one or more wafer layers, each having one surface. In this case, one or more surfaces may have a platinum layer or a platinum-containing layer.

Due to the very high degree of purity of the at least one platinum layer or platinum-containing layer on at least one surface of the substrate claimed herein, it is particularly suitable for producing an electronic component, in particular an electronic semiconductor component, or an electrode for a fuel cell. In the latter case, the at least one platinum layer or platinum-containing layer functions as a catalytic layer.

The object is also achieved by a method for producing an electronic component, in particular an electronic semiconductor component, or an electrode for a fuel cell using a platinum(IV) compound obtained or obtainable according to a method for producing platinum(IV) compounds in accordance with one of the exemplary embodiments described above, comprising the steps of:
a) providing the platinum(IV) compound,
b) depositing
i. at least one platinum layer
or
ii. at least one platinum-containing layer
on at least one surface of a substrate,
and
c) completing the electronic component, in particular the electronic semiconductor component, or the electrode for the fuel cell.

In step a), the provision of one or more platinum(IV) compounds may be provided. Furthermore, in step a), one or more platinum(IV) compounds may be provided independently of one another as a solid or as a solution comprising one or more platinum(IV) compounds.

The substrate may, for example, comprise one or more base metals or be manufactured from one or more base metals. Alternatively or additionally, the substrate may comprise one or more non-metallic materials or consist entirely of one or more non-metallic materials. Corundum foils or thin metallic foils can, for example, be used as the substrate. The substrate itself can be part of a component. In one embodiment, the substrate is a wafer. The wafer may comprise silicon, silicon carbide, germanium, gallium arsenide, indium phosphide, a glass, such as $SiO_2$, and/or a plastic, such as silicone, or consist entirely of one or more such materials. The wafer can also have one or more wafer layers, each having one surface. In this case, the deposition of one or more platinum layers or of one or more platinum-containing layers on one or more surfaces of the wafer may be provided.

Due to their very high degree of purity, the platinum(IV) compounds used here are particularly suitable as precursor compounds for the production of electronic semiconductor components and electrodes for fuel cells. This is, in particular, attributable to their production based on a method in accordance with one of the embodiments described above, namely using trimethylplatinum(IV) iodide, obtained or obtainable according to a method for producing trimethylplatinum(IV) iodide in accordance with one of the exemplary embodiments described above. This is because trimethylplatinum(IV) iodide obtained or obtainable in this way is substantially free of impurities by magnesium, sodium, and potassium salts, and elemental iodine, which are disadvantageous for the coating process and thus for the performance of the coated substrates. The definitions given above apply to the terms "substantially free of impurities by magnesium salts," "substantially free of impurities by potassium salts," "substantially free of impurities by sodium salts," and "substantially free of impurities by elemental iodine." In addition, the platinum(IV) compounds to be provided according to step a) can be prepared according to a method for producing such compounds in accordance with one of the embodiments described above in a particularly simple and comparatively cost-effective manner, which facilitates their use on an industrial scale.

With trimethylplatinum(IV) iodide obtained or obtainable according to a method for producing trimethylplatinum(IV) iodide in accordance with one of the embodiments described above, a defined platinum(IV) compound is provided. Trimethylplatinum(IV) iodide can be prepared in a simple, cost-effective and reproducible manner with a very high degree of purity and at good to very good yields, including space-time yields, by means of the method claimed. In addition, the method claimed is characterized in that it can also be carried out on an industrial scale, with a comparable yield, including space-time yield, and purity of the target compound. Overall, the claimed method for producing trimethylplatinum(IV) iodide and the trimethylplatinum(IV) iodide prepared in this way are to be assessed as satisfactory from an ecological and economic perspective. Due to its very high degree of purity, trimethylplatinum(IV) iodide thus obtained or obtainable is particularly suitable for use as the reactant for producing high-purity platinum(IV) precursor compounds which are to function to deposit platinum layers or platinum-containing layers, and as a precatalyst and as a catalyst. Due to the high-purity platinum layers or platinum-containing layers, substrates obtained or obtainable using the aforementioned platinum(IV) precursor compounds can be used particularly well for the production of electronic components, in particular electronic semiconductor components, and electrodes for fuel cells.

Other features, details, and advantages of the invention follow from the wording of the claims as well as from the following description of examples.

Working Instructions for the Synthesis of Trimethylplatinum(IV) Iodide

Materials and Methods:

All reactions, including the subsequent filtration, were carried out under standard inert gas conditions. The solvents and reagents used were purified and dried according to standard procedures. In the case of the Grignard reagent used as a solution, the content was determined by means of titration. The platinum content, magnesium content, and potassium content of the isolated product trimethylplatinum (IV) iodide were determined by means of ICP-OES.

EXAMPLE 1

Preparation of $Me_3PtI$ starting from $K_2[PtCl_6]$, MeI, and MeMgI in $CH_2Cl_2$ 125 g $K_2[PtCl_6]$ (50.4 g Pt, 0.258 moles) were transferred to a 1 L reactor vessel, and 500 mL of $CH_2Cl_2$ were added. 80 mL (1.29 moles, 5 eq.) iodomethane were then added at room temperature. At a flow temperature of 2° C., 430 mL of a solution of MeMgI in diethyl ether (3 M, 1.29 moles, 5 eq.)

were added within 45 minutes. After completion of the addition, the suspension was stirred for 16-20 h at a flow temperature of 10° C. The color of the suspension slowly changed from yellow to beige. During the reaction, gas production was observed and a temperature increase with respect to the flow temperature by up to 5° C. Excess Grignard reagent was quenched by adding 50 mL acetone within 20 minutes. The suspension was filtered at room temperature, and the filter cake was washed with 2000 mL $CH_2Cl_2$. The solvent of the combined filtrates was removed using a rotary evaporator (end conditions: 40° C., <500 mbar). 500 mL of acetone were then added and the pressure was slowly reduced to 300 mbar. Thereafter, 500 mL of deaerated distilled water were added and the pressure was slowly reduced to <100 mbar. The product suspension was then filtered. The product obtained as a solid was washed with dilute hydrochloric acid, water (up to pH neutrality), and finally with acetone. 93 g of trimethylplatinum(IV) iodide (53.1% Pt) was isolated in the form of an off-white powder (98% metal yield). $^1$H-NMR in benzene-de only shows the product signal: singlet at 1.74 ppm with $^{195}$Pt satellites, H-Pt coupling=77.21 Hz). The magnesium content was <300 ppm. The potassium content was <50 ppm.

EXAMPLE 2

Preparation of $Me_3PtI$ starting from $K_2[PtCl_6]$, MeI, and MeMgI in $CH_2Cl_2$ This was carried out analogously to that described in Example 1. The only difference was that the addition of the 3-molar ethereal MeMgI solution was carried out at a flow temperature of 20° C. instead of 2° C. and the suspension was also stirred at a flow temperature of 20° C. for 16-20 h after completion of the addition. Trimethylplatinum(IV) iodide was obtained in comparable yield and quality.

The invention is not limited to one of the embodiments described above but may instead be modified in many ways.

It can be seen that the invention relates to a method for producing trimethylplatinum(IV) iodide, and trimethylplatinum(IV) iodide obtainable or obtained according to said method, and the use thereof as a reactant for producing high-purity platinum(IV) compounds, as a precatalyst and as a catalyst. Subject matter of the invention are also the aforementioned platinum(IV) compounds and their use as precursors for the deposition of platinum layers and platinum-containing layers on a surface of a substrate. The invention also relates to a substrate comprising a platinum layer or a platinum-containing layer on one surface, and a method for producing an electronic component, in particular an electronic semiconductor component, or an electrode for a fuel cell using a platinum(IV) compound obtained or obtainable using trimethylplatinum(IV) iodide, which can be obtained by means of the method described herein.

With trimethylplatinum(IV) iodide obtained or obtainable according to a method for producing trimethylplatinum(IV) iodide in accordance with one of the embodiments described above, a defined platinum(IV) compound is provided. Trimethylplatinum(IV) iodide can be prepared in a simple, cost-effective, and reproducible manner with a very high degree of purity and at good to very good yields, including space-time yields, by means of the method claimed. Moreover, the method described herein can also be carried out on an industrial scale with comparable yield, including space-time yield, and purity of the target compound. Overall, the claimed method for producing trimethylplatinum(IV) iodide and the trimethylplatinum(IV) iodide prepared in this way are to be assessed as satisfactory from an ecological and economic perspective. Due to its very high degree of purity, trimethylplatinum(IV) iodide obtained or obtainable in this way is particularly suitable for use as a reactant for producing high-purity platinum(IV) precursor compounds which are to serve for the deposition of platinum layers or platinum-containing layers, and as a precatalyst and as a catalyst.

Any features and advantages resulting from the claims and the description, including constructive details, spatial arrangements, and method steps, may be relevant to the invention, either alone or in the various combinations.

The invention claimed is:

1. A method for producing trimethyl platinum (IV) iodide, comprising a reaction of at least one platinum compound selected from the group consisting of platinum (II) compounds and platinum (IV) compounds, with
    at least one methyl Grignard compound according to the general formula MeMgX, wherein X are independently selected from the group consisting of Cl, Br, and I, and iodomethane
in an aprotic polar solvent $S_A$ comprising an ether $S_E$ and a halogenated alkane $S_H$, other than the iodomethane, wherein a molar ratio of Pt metal:MeMgX:iodomethane is between 1:4:4 and 1:6:6.

2. The method according to claim 1, wherein at least one platinum compound is a platinum (II) salt or a platinum (IV) salt, wherein platinum (II) or platinum (IV) is contained in the cation or anion.

3. The method according to claim 1, wherein the at least one platinum compound is a platinum halide or a halide platinate.

4. The method according to claim 1, wherein
  at least one platinum compound is provided which is selected from the group consisting of $PtX_2$, $[(C_2H_4)PtX_2]_2$, $M[(C_2H_4)PtX_3]$, $M_2[PtX_4]$, $PtX_4$, $M_2[PtX_6]$, derivatives and isomers thereof, and mixtures thereof, wherein
    X are each independently selected from the group consisting of F, Cl, Br, and I and
    M are independently selected from the group consisting of alkali metals, alkaline earth metals, and silver.

5. The method according to claim 1, wherein the at least one methyl Grignard compound comprises MeMgI or is MeMgI.

6. The method according to claim 1, wherein the aprotic polar solvent $S_A$ has a boiling temperature $T_A$, wherein the boiling temperature $T_A$ is between 30° C. and 140° C.

7. The method according to claim 1, wherein the halogenated alkane $S_H$ is selected from the group consisting of dichloromethane, 1,1-dichloroethane, 1,2-dichloroethane, dibromomethane, 1,1-dibromoethane, 1,2-dibromoethane, and isomers thereof, and mixtures thereof.

8. The method according to claim 1, wherein the ether $S_E$ is selected from the group consisting of tetrahydrofuran, methyl tetrahydrofuran, 1,4-dioxane, diethyl ether, methyl tert-butyl ether, di-n-propyl ether, diisopropyl ether, cyclopentyl methyl ether, and isomers thereof, and mixtures thereof.

9. The method according to claim 1, wherein the molar ratio of MeMgX:iodomethane is between 1:1.5 and 1.5:1.

10. The method according to claim 1, wherein the reaction comprises the following steps:
  i) providing the at least one platinum compound,
  ii adding the iodomethane,
  and
  iii) adding the at least one methyl Grignard compound according to the general formula MeMgX.

11. The method according to claim 1, wherein the reaction takes place in an inert gas atmosphere.

12. The method according to claim 1, wherein, after the reaction, a step is carried out, which comprises isolating trimethylplatinum (IV) iodide:
  as a solution comprising trimethylplatinum (IV) iodide and the aprotic polar solvent $S_A$
  or
  as a solid.

13. The method according to claim 1, wherein the method further comprises concentrating a mother liquor produced by the reaction.

14. The method according to claim 1, wherein the method further comprises precipitating the trimethylplatinum (IV) iodide.

15. The method according to claim 1, wherein the method further comprises washing the trimethylplatinum (IV) iodide, and optionally also drying the trimethylplatinum (IV) iodide.

16. The method according to claim 1, wherein the method further comprises the steps of:
  a) providing the trimethylplatinum (IV) iodide as a solid or as a solution comprising trimethylplatinum (IV) iodide and the aprotic polar solvent SA, and b) carrying out a chemical reaction using the trimethylplatinum (IV) iodide as a catalyst or as a precatalyst.

17. The method according to claim 1, wherein the method further comprises the steps of:
  a) providing the trimethylplatinum (IV) iodide as a solid or as a solution comprising trimethylplatinum (IV) iodide and the aprotic polar solvent SA, and b) synthesizing a platinum (IV) compound using the trimethylplatinum (IV) iodide as a reactant.

18. The method according to claim 17, wherein the method further comprises depositing a platinum layer or a platinum-containing layer on the surface of a substrate using the platinum (IV) compound as precursor compound.

* * * * *